United States Patent
Low et al.

(10) Patent No.: US 8,330,127 B2
(45) Date of Patent: Dec. 11, 2012

(54) FLEXIBLE ION SOURCE

(75) Inventors: Russell J. Low, Rowley, MA (US); Jay T. Scheuer, Rowley, MA (US); Alexander S. Perel, Danvers, MA (US); Craig R. Chaney, Rockport, MA (US); Neil J. Bassom, Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 598 days.

(21) Appl. No.: 12/080,028

(22) Filed: Mar. 31, 2008

(65) Prior Publication Data

US 2009/0242793 A1 Oct. 1, 2009

(51) Int. Cl.
*G21K 5/00* (2006.01)

(52) U.S. Cl. ............ 250/492.21; 250/492.1; 250/492.3

(58) Field of Classification Search .................. None
See application file for complete search history.

(56) References Cited

U.S. PATENT DOCUMENTS

| | | | |
|---|---|---|---|
| 5,517,077 A | 5/1996 | Bright et al. | |
| 5,554,852 A * | 9/1996 | Bright et al. | 250/492.21 |
| 5,850,084 A * | 12/1998 | Holkeboer | 250/423 R |
| 5,886,355 A | 3/1999 | Bright et al. | |
| 5,903,009 A * | 5/1999 | Bernstein et al. | 250/492.21 |
| 5,909,031 A * | 6/1999 | Kellerman et al. | 250/492.21 |
| 5,973,329 A * | 10/1999 | Kim | 250/427 |
| 6,184,532 B1 * | 2/2001 | Dudnikov et al. | 250/423 R |
| 6,242,750 B1 * | 6/2001 | Takahashi et al. | 250/492.21 |
| 6,300,636 B1 * | 10/2001 | Shih et al. | 250/426 |
| 6,319,369 B1 * | 11/2001 | Flynn et al. | 204/192.38 |
| 6,331,713 B1 * | 12/2001 | Smick et al. | 250/497.1 |
| 6,583,427 B1 | 6/2003 | Edmonds et al. | |
| 6,847,043 B2 * | 1/2005 | Murrell et al. | 250/426 |
| 7,476,868 B2 * | 1/2009 | Kim et al. | 250/423 R |
| 7,586,101 B2 * | 9/2009 | Murrell et al. | 250/426 |
| 2001/0030284 A1 * | 10/2001 | Dresch et al. | 250/287 |
| 2002/0158213 A1 * | 10/2002 | Matsunaga et al. | 250/492.21 |
| 2003/0116705 A1 * | 6/2003 | Kanik et al. | 250/287 |
| 2003/0197129 A1 * | 10/2003 | Murrell et al. | 250/423 R |
| 2004/0238753 A1 * | 12/2004 | Mikolas | 250/396 R |
| 2006/0108531 A1 * | 5/2006 | Lo et al. | 250/346 |
| 2007/0089980 A1 * | 4/2007 | Sainty et al. | 204/199 |
| 2008/0087219 A1 * | 4/2008 | Horsky | 118/698 |
| 2008/0129180 A1 * | 6/2008 | Murrell et al. | 313/337 |
| 2008/0230694 A1 * | 9/2008 | Frosien | 250/307 |
| 2008/0290298 A1 * | 11/2008 | Swenson | 250/492.3 |

FOREIGN PATENT DOCUMENTS

| | | |
|---|---|---|
| EP | 901149 A2 * | 3/1999 |
| JP | 11329336 A * | 11/1999 |

* cited by examiner

*Primary Examiner* — David A Vanore
*Assistant Examiner* — Andrew Smyth

(57) ABSTRACT

Liner elements to protect the ion source housing and also increase the power efficiency of the ion source are disclosed. Two liner elements, preferably constructed from tungsten, are inserted into the ion source chamber, one placed against each of the two sidewalls. These inserts are electrically biased so as to induce an electrical field that is perpendicular to the applied magnetic field. Such an arrangement has been unexpectedly found to increase the life of not only the ion chamber housing, but also the indirectly heated cathode (IHC) and the repeller. In addition, the use of these biased liner elements also improved the power efficiency of the ion source; allowing more ions to be generated at a given power level, or an equal number of ions to be generated at a lower power level.

17 Claims, 6 Drawing Sheets

FLEXIBLE ION SOURCE

BACKGROUND OF THE INVENTION

Ion implanters are commonly used in the production of semiconductor wafers. An ion source is used to create an ion beam, which is then directed toward the wafer. As the ions strike the wafer, they dope a particular region of the wafer. The configuration of doped regions defines their functionality, and through the use of conductive interconnects, these wafers can be transformed into complex circuits.

A block diagram of a representative ion implanter 100 is shown in FIG. 1. An ion source 110 generates ions of a desired species. In some embodiments, these species are atomic ions, which are best suited for high implant energies. In other embodiments, these species are molecular ions, which are better suited for low implant energies. These ions are formed into a beam, which then passes through a source filter 120. The source filter is preferably located near the ion source. The ions within the beam are accelerated/decelerated in column 130 to the desired energy level. A mass analyzer magnet 140, having an aperture 145, is used to remove unwanted components from the ion beam, resulting in an ion beam 150 having the desired energy and mass characteristics passing through resolving aperture 145.

In certain embodiments, the ion beam 150 is a spot beam. In this scenario, the ion beam passes through a scanner 160, which can be either an electrostatic or magnetic scanner, which deflects the ion beam 150 to produce a scanned beam 155-157. In certain embodiments, the scanner 160 comprises separated scan plates in communication with a scan generator. The scan generator creates a scan voltage waveform, such as a sine, sawtooth or triangle waveform having amplitude and frequency components, which is applied to the scan plates. In a preferred embodiment, the scanning waveform is typically very close to being a triangle wave (constant slope), so as to leave the scanned beam at every position for nearly the same amount of time. Deviations from the triangle are used to make the beam uniform. The resultant electric field causes the ion beam to diverge as shown in FIG. 1.

In an alternate embodiment, the ion beam 150 is a ribbon beam. In such an embodiment, there is no need for a scanner, so the ribbon beam is already properly shaped.

An angle corrector 170 is adapted to deflect the divergent ion beamlets 155-157 into a set of beamlets having substantially parallel trajectories. Preferably, the angle corrector 170 comprises a magnet coil and magnetic pole pieces that are spaced apart to form a gap, through which the ion beamlets pass. The coil is energized so as to create a magnetic field within the gap, which deflects the ion beamlets in accordance with the strength and direction of the applied magnetic field. The magnetic field is adjusted by varying the current through the magnet coil. Alternatively, other structures, such as parallelizing lenses, can also be utilized to perform this function.

Following the angle corrector 170, the scanned beam is targeted toward the workpiece 175. The workpiece is attached to a workpiece support. The workpiece support provides a variety of degrees of movement.

A traditional ion source is shown in FIG. 2. A chamber housing 10 defines an ion chamber 14. One side of the chamber housing 10 has an extraction aperture 12 through which the ions pass.

A cathode 20 is located on one end of the ion chamber 14. A filament 30 is positioned in close proximity to the cathode 20, outside of the ion chamber. A repeller 60 is located on the opposite end of the ion chamber 14.

The filament 30 is energized by filament power supply 54. The current passing through the filament 30 heats it sufficiently (i.e. above 2000° C.) so as to produce thermo-electrons. A bias power supply 52 is used to bias the cathode 20 at a substantially more positive voltage than the filament 30. The effect of this large difference in voltage is to cause the thermo-electrons emitted from the filament to be accelerated toward the cathode. As these electrons bombard the cathode, the cathode heats significantly, often to temperatures over 2000° C. The cathode, which is referred to as an indirectly heated cathode (IHC), then emits thermo-electrons into the ion chamber 14.

The arc supply 50 is used to bias the ion chamber housing 10 positively as compared to the cathode. The arc supply typically biases the housing 10 to a voltage about 50-100 Volts more positive than the cathode 20. This difference in voltage causes the electrons emitted from the cathode 20 to be accelerated toward the housing 10.

A magnetic field is preferably created in the direction 62, typically by using magnetic poles located outside the chamber. The effect of the magnetic field is to confine the emitted electrons within magnetic field lines. A second effect is to cause the electrons to move from the cathode toward the opposite end of the chamber in a spiraling fashion (as shown in FIG. 3).

Vapor or gas source 40 is used to provide atoms or molecules into the chamber 14. The molecules can be of a variety of species, including but not limited to inert gases (such as argon), hydrogen-containing gases (such as $PH_3$ and $AsH_3$) and other dopant-containing gases (such as $BF_3$). The temperature of the chamber, coupled with the emitted electrons traveling in the chamber 14 serve to transform this injected gas into a plasma.

At the far end of the chamber, opposite the cathode 20, a repeller 60 is preferably biased to the same voltage as the cathode 20. This causes the emitted electrons to be repelled away from the repeller 60 and back toward the cathode 20. The use of these like-biased structures at each end of the chamber 14 maximizes the interaction of the emitted electrons with the material (i.e. gas and plasma) that exists in the ion source chamber. The result of these interactions between the emitted electrons and the gas and plasma is the creation of ions.

FIG. 3 shows a different view of the ion source of FIG. 2. The magnet 86 creates a magnetic field 62 across the ion chamber. The cathode 20 and repeller 60 are maintained at the same potential, so as to repel the electrons away and toward the center of the chamber. When the gas interacts with the electrons, plasma 80 is created. An electrode 90 is biased to attract the ions through the extraction aperture 12. These extracted ions form an ion beam 95 and are used as described above.

The temperatures, corrosive gasses and emitted electrons create a harsh environment within the ion source. In fact, the conditions are such that tungsten parts that make up the housing are damaged within days. As a result, some ion source manufacturers have developed liners that can be inserted into the ion source. These liners cover the side and bottom surfaces of the ion source housing, thereby protecting the housing 10 from this harsh environment. These liners are typically made using tungsten or molybdenum and are simply slid into the housing. These liners are still damaged by the environment in the ion source; however, since these liners are typically much less costly than the ion source housing itself, it is cost effective to insert them into an ion source housing to prolong the useful life of the ion source housing. When the liners wear out, they are simply discarded and replaced with new ones.

These liners perform an important function in prolonging the life of an ion source and reducing the annual operating cost. In addition, it would also be beneficial if the ion source liner were also able to improve the power efficiency of the ion source, such that either more ions can be produced at a given power level, or an equal number of ions can be produced at a lower power level.

SUMMARY OF THE INVENTION

The problems of the prior art are addressed by the present disclosure, which describes liner elements to protect the ion source housing and also increases the efficiency of the ion source.

Two liner elements, preferably constructed from tungsten, are inserted into the ion source chamber, one placed against each of the two side walls. These inserts are biased so as to induce an electrical field that is perpendicular to the applied magnetic field. Such an arrangement has been found to increase the life of not only the ion chamber housing, but also the indirectly heated cathode (IHC) and the repeller for a given ion output.

In addition, the use of these biased liner elements also improved the power efficiency of the ion source; allowing more ions to be generated at a given power level, or an equal number of ions to be generated at a lower power level.

DETAILED DESCRIPTION OF THE INVENTION

Figure 1:
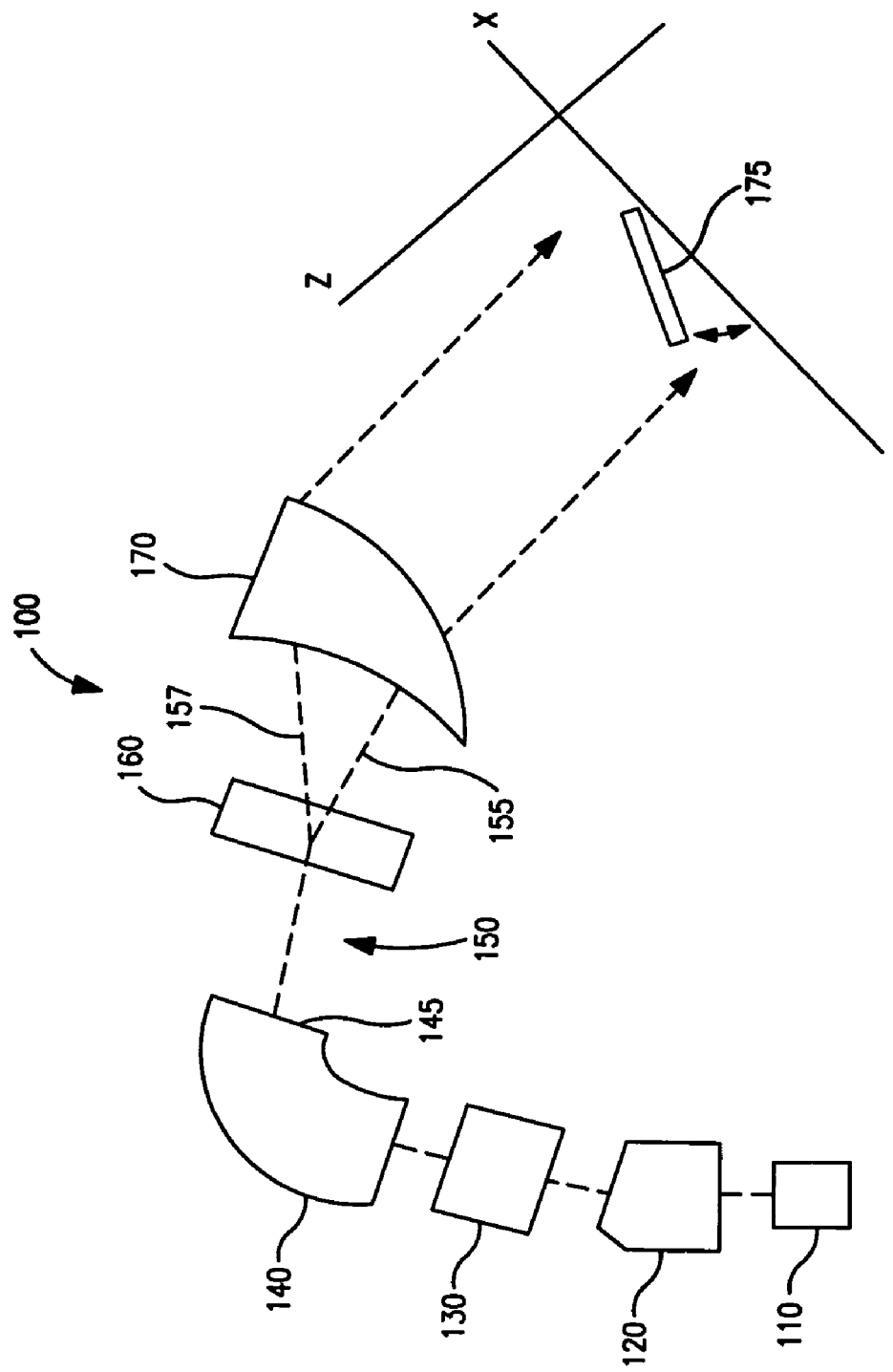
FIG. 1 illustrates a block diagram of a representative ion implanter.
Figure 2:
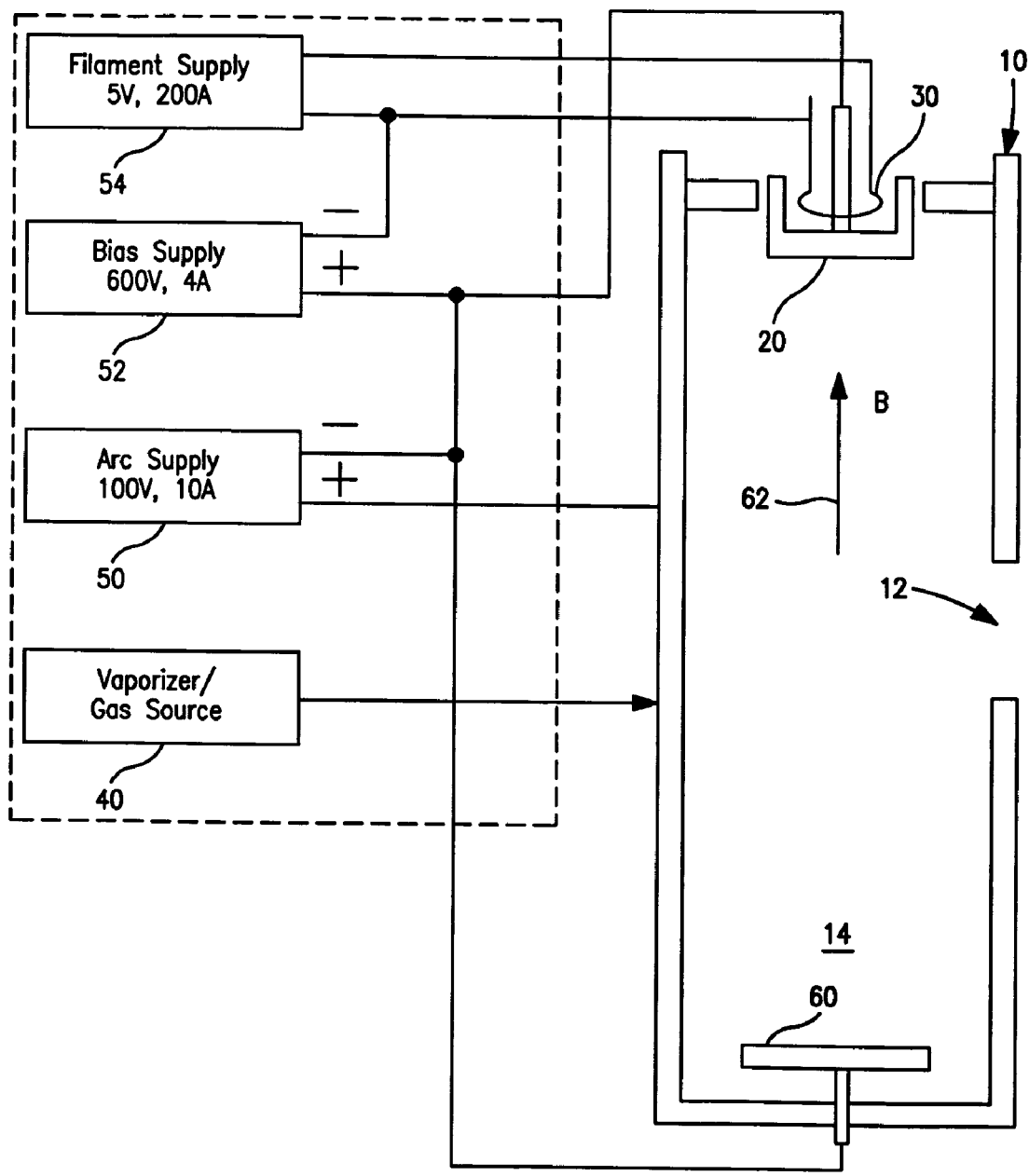
FIG. 2 illustrates a traditional ion source.
Figure 3:
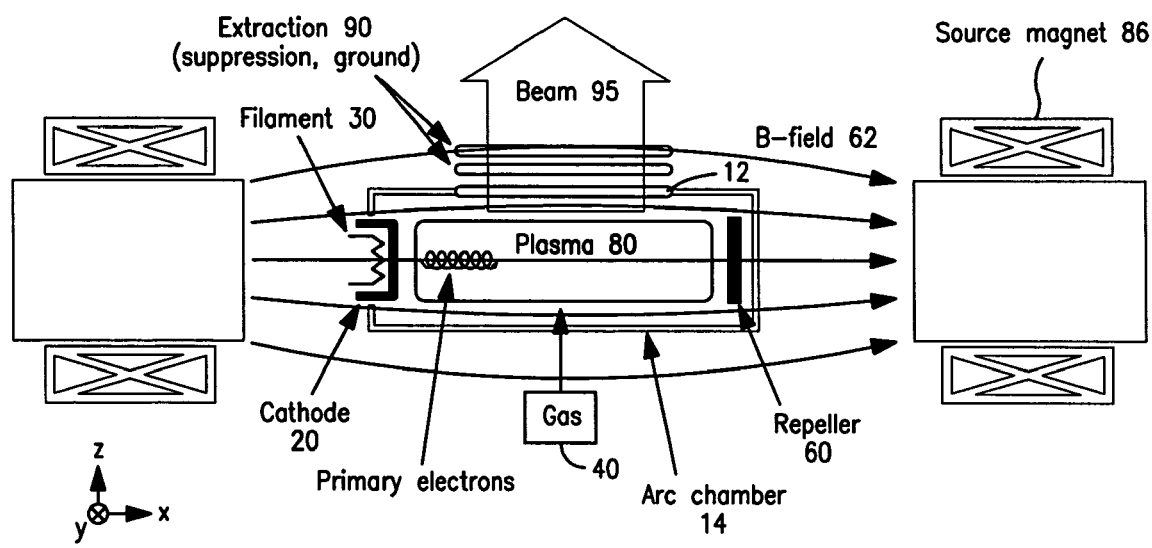
FIG. 3 shows the major components of the traditional ion source of FIG. 2.
Figure 4:
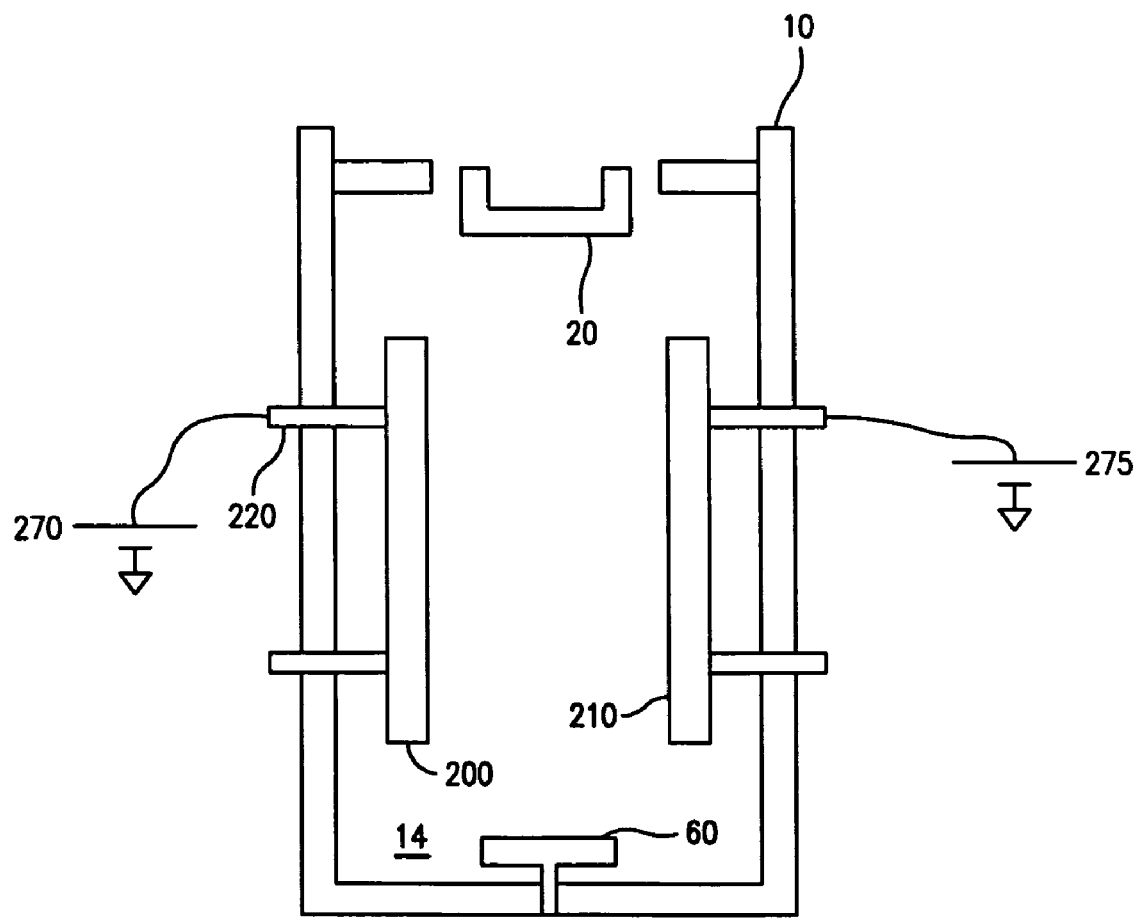
FIG. 4 illustrates a first embodiment.

FIG. 4 illustrates a first embodiment. Those elements that are common with those of a traditional ion source, as shown in FIG. 2, are given like reference designators. Located on each side of ion source housing 10 is a liner element 200, 210. These liner elements are positioned within the ion source housing 10, such as by bolts or clamps. In some embodiments, the liner element is affixed directly to the housing, while in others, it is electrically isolated from the housing. A first bias voltage 270 is applied to first liner element 200. In one embodiment, the power source is connected to the shaft 220 used to secure the liner element within the chamber 14. A second bias voltage 275 is connected to second liner element 210. In one embodiment, this bias voltage is the same as that applied to the source housing, as shown in FIG. 2. In a second embodiment, a bias voltage, different from that applied to the first liner element 200 and different from that applied to the source housing 10 is used.

Figure 5A:
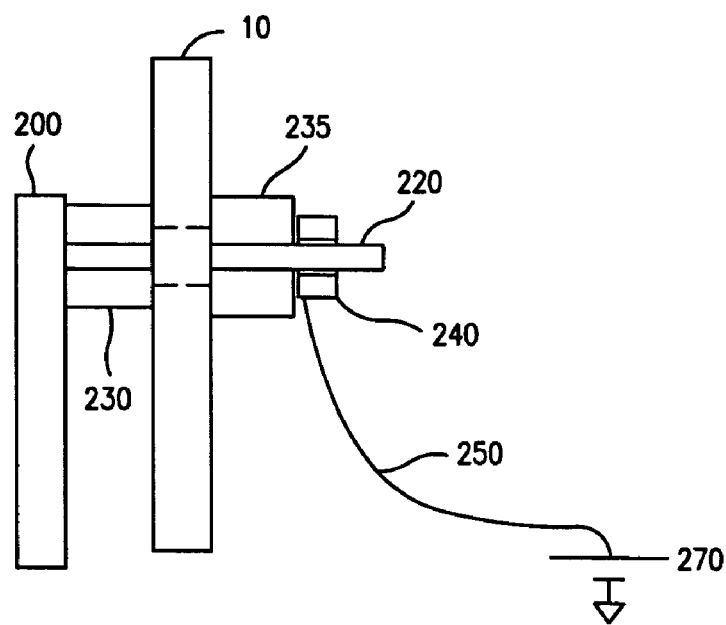
FIG. 5a shows an expanded view of one connection mechanism for the liner elements.

FIG. 5a shows an expanded view of the connection of the first liner element 200 to the ion source housing 10. In one embodiment, holes are drilled through the sidewalls of the ion source housing 10. An electrically conductive shaft 220, having a diameter smaller than the drilled hole, is passed through this hole and into a receptacle in the first liner element 200. In one embodiment, the shaft is a bolt, which can be threaded throughout its entire length or only threaded at its end. In an alternative embodiment, the shaft is an integral part of the liner element. In the preferred embodiment, two threaded shafts are used for each liner element to insure stability. A first insulator, such as an insulating ring, 230 is placed between the first liner element 200 and the sidewall of the housing 10. A second insulator, such as insulating ring 235 is placed between the outside of the sidewall and the fastener 240 used to secure the shaft. In one embodiment, these insulators are made from aluminum oxide ($Al_2O_3$) or boron nitride, capable of withstanding the temperatures within the ion source. It should be noted that the liner element 200 is sized so as not to contact the bottom or endwalls of the chamber housing, so as to be electrically isolated from the housing. Electrical conduit 250 is preferably attached to the shaft 220, preferably between the second insulating ring 235 and the bolt 240. Electrical conduit 250 is in communication with bias voltage 270. The use of insulating rings 230, 235 allows the shaft 220 and the liner element 200 to be at a different potential than the housing 10. The second liner element 210 can be attached to the housing 10 in a similar fashion. In an alternative embodiment, where the electrical potential of the second liner element 210 is the same as that of the housing 10, the insulating rings 230, 235 can be eliminated. Alternatively, these rings can be conductive, thereby allowing the liner element and the housing to be at the same potential. Similarly, in this embodiment, there is no need for an electrical conduit, since the liner element is in direct contact with the housing 10. In either scenario, the liner elements 200, 210 serve to block a portion of the sidewall from the ions generated within the chamber.

Figure 5B:
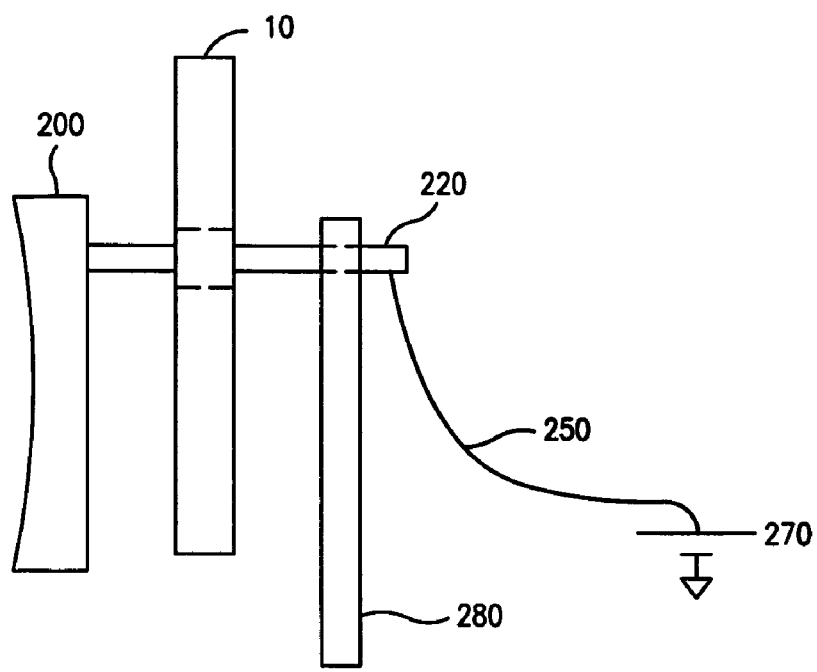
FIG. 5b shows an expanded view of a second connection mechanism for the liner elements.

FIG. 5b shows an expanded view of a second method of locating the liner elements within the ion source chamber. In this embodiment, holes are drilled through the sidewalls of the ion source housing 10. An electrically conductive shaft 220, having a diameter smaller than the drilled hole, is passed through this hole and into a receptacle in the first liner element 200. In one embodiment, the shaft 220 is a bolt, which can be threaded throughout its entire length or only threaded at its end. In an alternative embodiment, the shaft 220 is an integral part of the liner element 200. In the preferred embodiment, two shafts are used for each liner element to insure stability. Rather than utilize isolators to electrically separate the liner element 200 from the sidewall, an external positioning device 280, such as a clamp, is used to hold the shaft in place. In this way, the shaft has no physical contact (either directly or through an isolator) with the sidewall. The liner element 200 is sufficiently spaced from the sidewall and the bottom of the chamber housing so as to remain electrically isolated from the chamber housing. Electrical conduit 250 is preferably attached to the shaft 220, preferably outside of the source chamber housing. External positioning device 280 may be electrical isolated from the bolt 220. Alternatively, the external positioning device 280 may be electrically connected to the bolt 220. In this embodiment, the electrical conduit 250 can be connected directly to the external positioning device 280. The use of an external positioning device 280 and enlarged holes in the sidewalls allows the shaft 220 and the liner element 200 to be at a different potential than the housing 10. The second liner element 210 can be attached to the housing 10 in a similar fashion. In an alternative embodiment, where the potential of the second liner element 210 is the same as that of the housing 10, the second liner 210 can be bolted directly to the housing. In this embodiment, there is no need for an electrical conduit, since the liner element is in direct contact with the housing 10. In either scenario, the liner elements 200, 210 serve to block a portion of the sidewall from the ions generated within the chamber.

Returning to FIG. 4, it can be seen that the liner elements 200, 210, differ from the prior art in that they do not completely cover the housing 10. Rather, the liner elements are positioned only on the two sides of the housing 10, with no lining covering the bottom of the chamber. Furthermore, in the preferred embodiment, the liner elements do not cover the end walls of the chamber housing where the IHC and repeller are installed. Finally, the liner elements do not completely cover the side walls; rather the liner elements extended along the side wall only between the IHC and the repeller, as shown in FIG. 4.

This simplifies the process needed to replace these elements. In the prior art, to replace the source liner, the IHC and repeller needed to be removed first, to allow the source liner to then be removed. This increased the amount of time required for preventative maintenance, and therefore increased the downtime for the ion source. In the present disclosure, the operator need only unfasten the bolts connected to the liner elements and replace the liner element with a new one. The repeller and IHC are untouched during this operation.

Figure 6A:
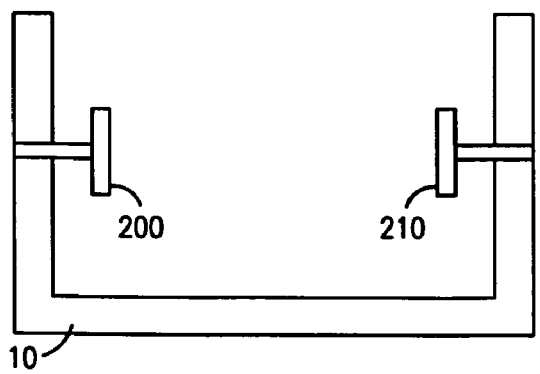
FIG. 6a shows a first shape of the liner elements.
Figure 6B:
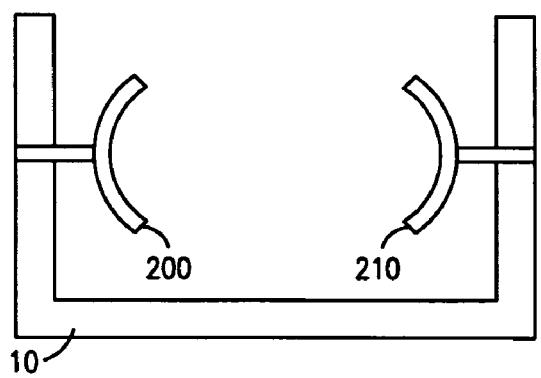
FIG. 6b shows a second shape of the liner elements.
Figure 6C:
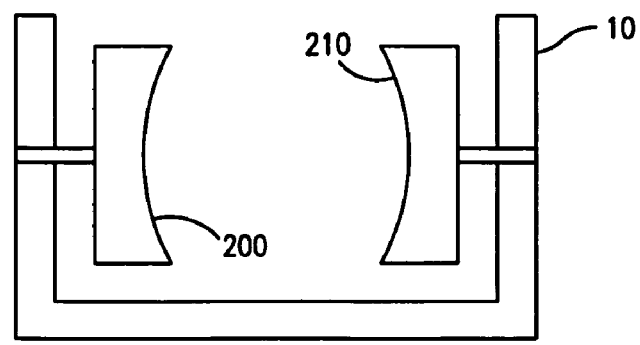
FIG. 6c shows a third shape of the liner elements.

The liner element can be formed in a variety of shapes. For example, the liner elements may be planar, as shown in FIG. 6a. In another embodiment, the liner elements are arcuate in shape, as shown in FIG. 6b. Preferably, the arcuate shape corresponds with the size and shape of the IHC and cathode. In another embodiment, shown in FIG. 6c, the outer face of the liner element, which faces toward the chamber is arcuate in shape, while the opposite side, which faces the sidewall is planar. In designing the shape of the liner element, it is important that the liner elements do not obstruct the electron path between the IHC and the repeller. In most embodiments, the IHC and repeller are circular, thus an arcuate shape is suitable for the liner elements. Based on this requirement, the structure shown in FIG. 6c allows the greatest amount of liner material, and thereby providing the greatest liner element useful life. However, other shapes are also possible and within the scope of the disclosure.

As described above, the liner elements 200, 210 are biased so as to create an electrical field that is perpendicular to the applied magnetic field. As is known by those of ordinary skill in the art, when a magnetic field is crossed by an electrical field, charged particles will experience a force in a third direction, perpendicular to both the magnetic and electrical fields. By properly configuring the applied magnetic field and the electrical field between the liner elements, the ions created in the ion chamber will be pushed upward toward the aperture 12. This force allows hotter ions to be pushed out of the ion source, thereby allowing the ion source to be more energy efficient than those of the prior art. Thus, the ion source can be powered such that at a given energy level, the ion source produces more ions than those of the prior art. Alternatively, the ion source can be powered so as to produce the same amount of ions at a lower power level. This is particularly advantageous in the production of multiply charged ions, i.e. ions with a charge of +2 or greater, such as $P^{++}$ and $P^{+++}$.

Furthermore, the use of biased liner elements 200, 210 prolongs the life of the ion source. As described earlier, by covering the housing 10 with a liner, the life of the ion source housing can be prolonged. However, the source liners also increase the life of the IHC and the repeller, an effect not realized in the prior art. Because of the harsh conditions, the IHC and repeller are damaged during normal operation due to sputtering and tungsten deposition. To combat this, the thickness of the repeller can be increased to prolong its useful life. However, the same cannot be done for the IHC, since increased thickness would require more power to be consumed in allowing the IHC to reach the required temperatures. Thus, the IHC fails relatively quickly. By applying an electrical bias to one (or both) of the liner elements, sputtering and tungsten deposition is increased on the liner elements, and it is possible to operate the source with a reduced bias between the cathode and repeller and the walls of the arc chamber. This decreases wear on the cathode and repeller and serves to further decrease the cost of ownership associated with the ion source by prolonging the useful life of the IHC and the repeller.

Because of these harsh conditions, preventative maintenance is typically performed on a regular basis on traditional ion sources. At certain intervals, the IHC and repeller must be replaced. At somewhat longer intervals, the source liners are also replaced. However, by using the liner elements, the preventative maintenance schedule is greatly reduced. Various studies have demonstrated that the liner elements described in the present disclosure allow the IHC to last up to three times as long as previously possible. For example, for the same ion output, the biased side plates have shown an increase of 300% on $P^{++}$ & $P^{+++}$ source life.

To further increase the life of the liner elements, it is also envisioned that the electrical bias of the two liner elements 200, 210 can be reversed. It should be noted that the direction of the applied magnetic field must also be reversed at this time as well such that charged particles are still directed toward the aperture.

The bias voltages applied to the liner elements 200, 210 can also be varied. For example, as described above, one element may be biased to the same potential as the source housing 10, while the other is more positively biased. Alternatively, both can be biased at a potential higher than the housing 10. Moreover, one liner element can be biased more negatively than the housing, while the other is more positively biased. An important characteristic is the difference in potential between the two liner elements. By varying the voltage potential between the liner elements, the rate of sputtering (and erosion) can be controlled. For example, in some applications, the liner elements can be excellent sputter sources. These sources tend to degrade over time, due to erosion. To reverse these effects, the bias potential between the liner elements can be increased, thereby maintaining the previous level of performance, and prolonging the life of the liner elements.

While this disclosure has described specific embodiments disclosed above, it is obvious to one of ordinary skill in the art that many variations and modifications are possible. Accordingly, the embodiments presented in this disclosure are intended to be illustrative and not limiting. Various embodiments can be envisioned without departing from the spirit of the disclosure.

What is claimed is:

1. An ion source comprising:
   an ion chamber housing defining an ion chamber, said housing comprising an endwall where an electron source is located, an opposing endwall, first and second sidewalls positioned at opposite sides of said housing, a bottom and a top having an aperture through which ions can pass;
   a first liner element located within said chamber and positioned so as to block a portion of said first sidewall, said first liner element comprising a first concave surface;

a second liner element located within said chamber and positioned so as to block a portion of said second sidewall, said second liner element having the same potential as said housing and comprising a second concave surface, the first and second concave surfaces facing one another; and a power source adapted to provide a different voltage potential to each of said liner elements.

2. The ion source of claim 1, wherein said first liner element has more positive potential than said housing.

3. The ion source of claim 1, wherein said first and second liner elements do not extend the entire length of said sidewall.

4. The ion source of claim 1, wherein said liner elements are configured to generate an electric field perpendicular to a magnetic field between said liner elements.

5. The ion source of claim 4, wherein said magnetic field and said electrical field are configured such that charged particles within said housing are forced toward said aperture.

6. The ion source of claim 1, wherein said first sidewall comprises at least one opening, further comprising a shaft affixed to said first liner element, such that said shaft is inserted through said opening and is used to hold said first liner element within said chamber.

7. The ion source of claim 6, further comprising an insulator positioned between said first liner element and said first sidewall, such that said shaft and said sidewall are electrically isolated.

8. The ion source of claim 7, wherein said power supply is in communication with said shaft.

9. The ion source of claim 6, wherein said shaft is held in place by an external positioning device, such that said shaft and said sidewall are electrically isolated.

10. The ion source of claim 1, wherein said power supply comprises an adjustable supply, adapted to vary the voltage supplied to said liner elements.

11. A method of generating ions, comprising:
providing an ion chamber housing defining an ion chamber, said housing comprising an endwall where an electron source is located, an opposing end wail, first and second sidewalls located at opposite sides of said chamber housing, a bottom and a top having an aperture through which ions can pass;
providing a first liner element within said chamber to block a portion of said first sidewall, the first liner element having a first concave surface;
providing a second liner element within said chamber to block a portion of said second sidewall, the second liner element having a second concave surface, the first and second concave surfaces facing one another, wherein said voltage supplied to said second liner element is the same as the voltage potential of said housing;
energyzing said electron source; and
supplying a different voltage potential to each of said liner elements.

12. The method of claim 11, wherein said voltage supplied to said first liner element is different than the voltage potential of said housing.

13. The method of claim 11, wherein said voltage supplied to said liner elements is adjusted to vary the rate of ion generation.

14. The method of claim 11, wherein a shaft is affixed to each of said liner elements, a hole is located in each sidewall and said shaft is inserted into said hole so as to locate said liner element inside said chamber.

15. The method of claim 14, wherein said liner element and said sidewall are electrically isolated.

16. The method of claim 15, further comprising using an external positioning device, located outside said chamber, to hold said shaft.

17. An ion source comprising:
a housing;
an electrode source disposed in the housing;
a first liner element disposed at a first side of the housing; and
a second liner element disposed at a second side of the housing, the first and second sides being opposite sides of the housing, wherein the first and second liner elements are maintained at different voltage potential and wherein said second liner element and the housing is maintained at same potential.

* * * * *

UNITED STATES PATENT AND TRADEMARK OFFICE
CERTIFICATE OF CORRECTION

PATENT NO.      : 8,330,127 B2
APPLICATION NO. : 12/080028
DATED           : December 11, 2012
INVENTOR(S)     : Low et al.

Page 1 of 1

It is certified that error appears in the above-identified patent and that said Letters Patent is hereby corrected as shown below:

Column 7, Claim 11, line 40,
Please replace "end wail" with --endwall--

Signed and Sealed this
Fifth Day of February, 2013

Teresa Stanek Rea
*Acting Director of the United States Patent and Trademark Office*